(12) United States Patent
Yang et al.

(10) Patent No.: US 9,443,838 B2
(45) Date of Patent: Sep. 13, 2016

(54) METHOD OF FABRICATING INTEGRATED CIRCUITS, INTEGRATED CIRCUIT COMPONENT MASK LAYOUT SET, AND COMPONENT PHOTOMASK SET

(75) Inventors: Li-Ping Yang, Taipei (TW); Pi-Cheng Chen, Hsin Chu (TW); Han-Chang Kang, Hsin-Chu (TW); Ran-Hong Yan, Holmdel, NJ (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 1751 days.

(21) Appl. No.: 12/454,283

(22) Filed: May 15, 2009

(65) Prior Publication Data

US 2009/0286358 A1 Nov. 19, 2009

(30) Foreign Application Priority Data

May 16, 2008 (TW) .............................. 097118127 A (51) Int. Cl.
*H01L 27/02* (2006.01)
(52) U.S. Cl.
CPC ................................. *H01L 27/0207* (2013.01)
(58) Field of Classification Search
CPC .................................................. H01L 27/0207
USPC ........................................................ 438/462
See application file for complete search history.

(56) References Cited

U.S. PATENT DOCUMENTS

| | | | | |
|---|---|---|---|---|
| 5,801,406 A | * | 9/1998 | Lubow et al. | 257/202 |
| 2002/0136046 A1 | * | 9/2002 | Kim et al. | 365/63 |
| 2003/0214317 A1 | * | 11/2003 | Kirloskar et al. | 324/765 |
| 2004/0036846 A1 | * | 2/2004 | Nishi | 355/18 |
| 2004/0245618 A1 | * | 12/2004 | Mayer | 257/687 |
| 2007/0011639 A1 | * | 1/2007 | Pitts | G06F 17/5072 716/52 |
| 2008/0022254 A1 | * | 1/2008 | Luo | G06F 17/5068 716/52 |

* cited by examiner

*Primary Examiner* — John P Dulka
(74) *Attorney, Agent, or Firm* — McClure, Qualey & Rodack, LLP (57) ABSTRACT

A method of fabricating integrated circuits includes the steps of: a) with reference to a physical design of a hardware unit, preparing an integrated circuit component mask layout set associated with component photomasks suitable for fabricating an array of the hardware units on a wafer; b) preparing the component photomasks with reference to the integrated circuit component mask layout set; c) forming the array of the hardware units and interconnections between adjacent hardware units on the wafer using the component photomasks prepared in step b) ; and d) cutting the wafer along selected ones of the scribe lines so as to form a plurality of integrated circuit dies. Each of the integrated circuit dies is independently selected from a single-type including only one of the hardware units, and a multi-type including a plurality of the hardware units that are interconnected electrically via uncut ones of the conductive paths.

5 Claims, 7 Drawing Sheets

METHOD OF FABRICATING INTEGRATED CIRCUITS, INTEGRATED CIRCUIT COMPONENT MASK LAYOUT SET, AND COMPONENT PHOTOMASK SET

CROSS-REFERENCE TO RELATED APPLICATION

This application claims priority under 35 U.S.C. 119 to Taiwan Application No. 097118127, filed on May 16, 2008, which application is incorporated herein by reference and made a part hereof in its entirety.

BACKGROUND OF THE INVENTION

1. Field of the Invention

The invention relates to an integrated circuit design technique, more particularly to a method of fabricating integrated circuits.

2. Description of the Related Art

It is common for a system to use multiple hardware units with similar functionalities in order to enhance operational efficiency of the system. Examples include incorporating a number of receivers in a communication system to enhance reception and incorporating a number of processors in a computer system in order to accelerate computing speed and enhance computing capability. The number of required hardware units depends on the level and purpose of the particular application.

There are three conventional ways of providing multiple hardware units in a system.

In a first conventional method, a set of photomasks is utilized to fabricate dies, each containing a single hardware unit, and then a desired number of dies are packaged together so as to form an integrated circuit chip that contains multiple hardware units, such is commonly referred to as "system in package". Although the cost incurred when fabricating the photomasks is reduced, packaging costs are high. In addition, communication between the hardware units in each integrated circuit chip is limited by the number of pads contained in each die in the integrated circuit chip, which has an adverse effect on transmission speed.

In a second conventional method, for each particular application purpose, a distinct set of photomasks is prepared for use in fabricating integrated circuit chips each including a corresponding number of hardware units as required for that particular application purpose. Although communication among the hardware units in each integrated circuit chip is relatively less problematic, it is relatively costly to produce a set of photomasks custom-made for each particular application purpose.

In a third conventional method, a set of photomasks is used to fabricate integrated circuit chips, each containing a single hardware unit, and then the desired number of integrated circuit chips are mounted on a printed circuit board (PCB) so as to form the desired system. Although this method reduces the complexity of photomask production and packaging, communication among the hardware units is limited by the number of pins on each integrated circuit chip. In addition, packaging costs are still significant.

SUMMARY OF THE INVENTION

Therefore, the object of the present invention is to provide a method of fabricating integrated circuits that would reduce mask and packaging costs, that is capable of utilizing a single set of masks for producing integrated circuit chips containing varying numbers of hardware units, and that imposes relatively little restraints on communications between the hardware units within a single integrated circuit chip.

According to one aspect of the present invention, there is provided a method of fabricating integrated circuits that includes the steps of:

a) with reference to a physical design of a circuit of a hardware unit, preparing an integrated circuit component mask layout set associated with component photomasks suitable for fabricating an array of the hardware units on a wafer, wherein the integrated circuit component mask layout set has an array of component mask layout portions that correspond respectively to places of the hardware units on the wafer, and a grid of spacer lines that serve to isolate adjacent ones of the component mask layout portions from each other, such that the hardware units are spaced apart from each other by a grid of scribe lines corresponding to the spacer lines when the hardware units are formed on the wafer using the component photomasks, and wherein the integrated circuit component mask layout set further has interconnect mask layout portions that are suitable for fabricating interconnections on the wafer, the interconnections establishing electrical connections between adjacent ones of the hardware units on the wafer via a plurality of conductive paths that span the scribe lines;

b) preparing the component photomasks with reference to the integrated circuit component mask layout set, wherein each of the component photomasks has component mask portions respectively corresponding to the component mask layout portions, and configured for fabricating the array of the hardware units on the wafer, wherein each of a subset of the component photomasks further has interconnect mask portions corresponding to the interconnect mask layout portions, and configured for fabricating the interconnections on the wafer;

c) forming the array of the hardware units and the interconnections on the wafer using the component photomasks prepared in step b); and d) cutting the wafer along selected ones of the scribe lines so as to form a plurality of integrated circuit chips.

Each of the integrated circuit chips is independently selected from a single-type including only one of the hardware units, and a multi-type including a plurality of the hardware units that are interconnected electrically via uncut ones of the conductive paths.

According to another aspect of the present invention, there is provided a method of fabricating integrated circuits that includes the steps of:

a) with reference to a physical design of a circuit of a hardware unit, preparing a plurality of component photomasks suitable for fabricating an array of hardware units on a wafer, wherein each of the component photomasks has an array of component mask portions that correspond respectively to places of the hardware units on the wafer, and a grid of spacer lines that serve to isolate adjacent ones of the component mask layout portions from each other, such that the hardware units are spaced apart from each other by a grid of scribe lines corresponding to the spacer lines when the hardware units are formed on the wafer using the component photomasks, wherein each of a subset of the component photomasks further has interconnect mask portions that are configured for fabricating interconnections on the wafer, the interconnections establishing electrical connections between adjacent ones of the hardware units on the wafer via a plurality of conductive paths that span the scribe lines;

b) forming the array of the hardware units and the interconnections on the wafer using the component photomasks prepared in step a); and c) cutting the wafer along selected ones of the scribe lines so as to form a plurality of integrated circuit dies.

Each of the integrated circuit dies is independently selected from a single-type including only one of the hardware units, and a multi-type including a plurality of the hardware units that are interconnected electrically via uncut ones of the conductive paths.

According to still another aspect of the present invention, there is provided a method of fabricating integrated circuits that includes the steps of:

a) forming on a wafer an array of hardware units that are spaced apart from each other by a grid of scribe lines, and interconnections that establish electrical connections between adjacent ones of the hardware units on the wafer via a plurality of conductive paths that span the scribe lines; and b) cutting the wafer along selected ones of the scribe lines so as to form a plurality of integrated circuit dies.

Each of the integrated circuit dies is independently selected from a single-type including only one of the hardware units, and a multi-type including a plurality of the hardware units that are interconnected electrically via uncut ones of the conductive paths.

According to yet another aspect of the present invention, there is provided an integrated circuit component mask layout set that is associated with component photomasks suitable for fabricating an array of hardware units on a wafer. The integrated circuit component mask layout set includes an array of component mask layout portions, a grid of spacer lines, and interconnect mask layout portions. The component mask layout portions correspond respectively to places of the hardware units on the wafer. The grid of spacer lines serve to isolate adjacent ones of the component mask layout portions from each other, such that the hardware units are spaced apart from each other by a grid of scribe lines corresponding to the spacer lines when the hardware units are formed on the wafer using the component photomasks. The interconnect mask layout portions are suitable for fabricating interconnections on the wafer. The interconnections establish electrical connections between adjacent ones of the hardware units on the wafer via a plurality of conductive paths that span the scribe lines.

According to a further aspect of the present invention, there is provided a component photomask set suitable for fabricating an array of hardware units on a wafer, and including a plurality of component photomasks. Each of the component photomasks has an array of component mask portions that correspond respectively to places of the hardware units on the wafer, and a grid of spacer lines that serve to isolate adjacent ones of the component mask layout portions from each other, such that the hardware units are spaced apart from each other by a grid of scribe lines corresponding to the spacer lines when the hardware units are formed on the wafer using the component photomasks. Each of a subset of the component photomasks further has interconnect mask portions that are configured for fabricating interconnections on the wafer, the interconnections establishing electrical connections between adjacent ones of the hardware units on the wafer via a plurality of conductive paths that span the scribe lines.

BRIEF DESCRIPTION OF THE DRAWINGS

Other features and advantages of the present invention will be come apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

The method of fabricating integrated circuits of the present invention is adapted for fabricating, with the use of a single set of photomasks, single-type and multi-type integrated circuits respectively including one and multiple hardware units. In addition, the method of the present invention also facilitates the use of a subset of the photomasks prepared to fabricate integrated circuits, each including a first number of hardware units, in addition to a limited number of replaceable photomasks in order to fabricate integrated circuits, each including a second number of hardware units, thereby significantly reducing costs incurred in connection with photomask production.

Figure 1:
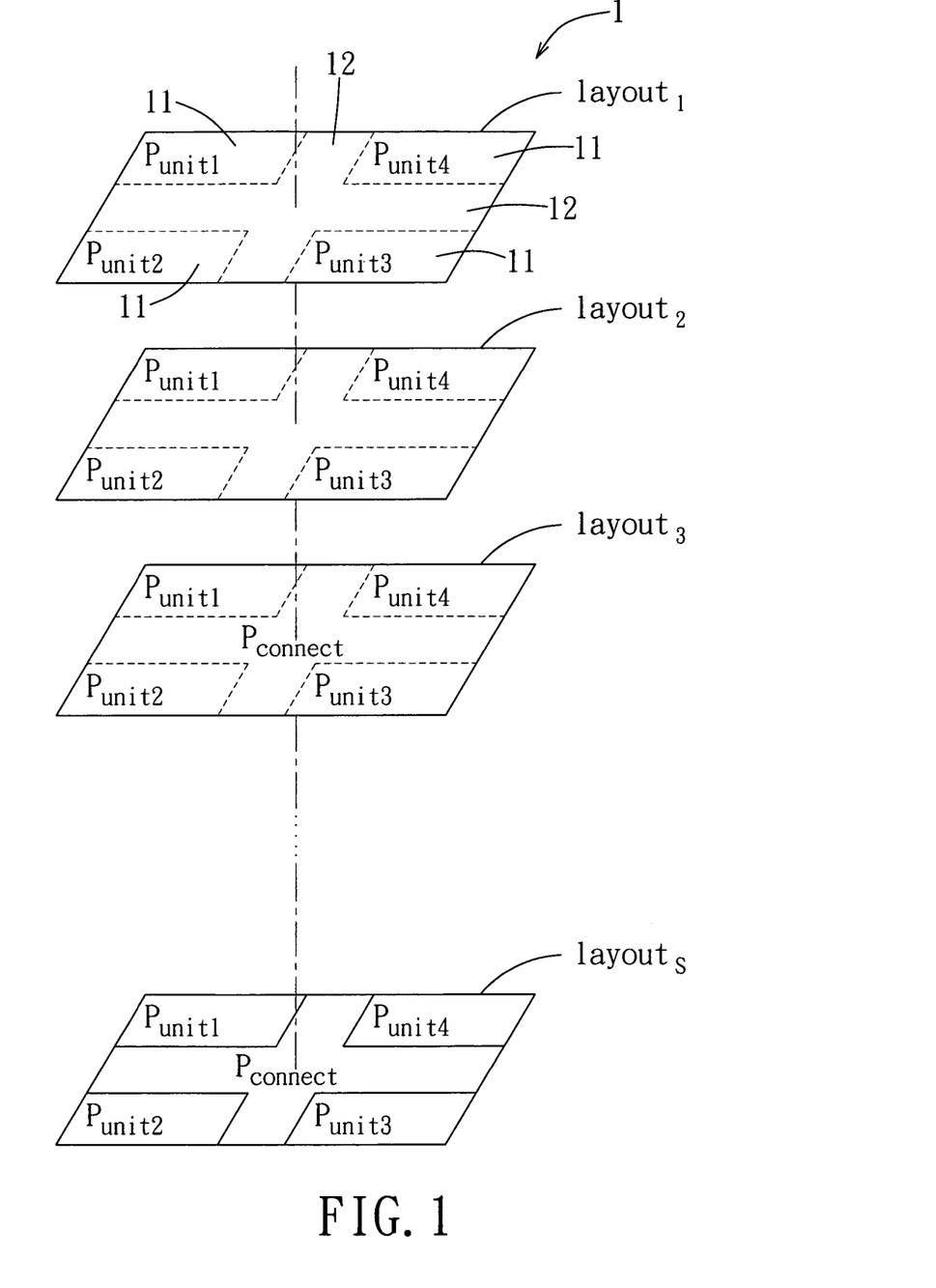
FIG. 1 is a schematic diagram, illustrating an integrated circuit component mask layout set prepared according to the method of fabricating integrated circuits of the present invention.
Figure 2:
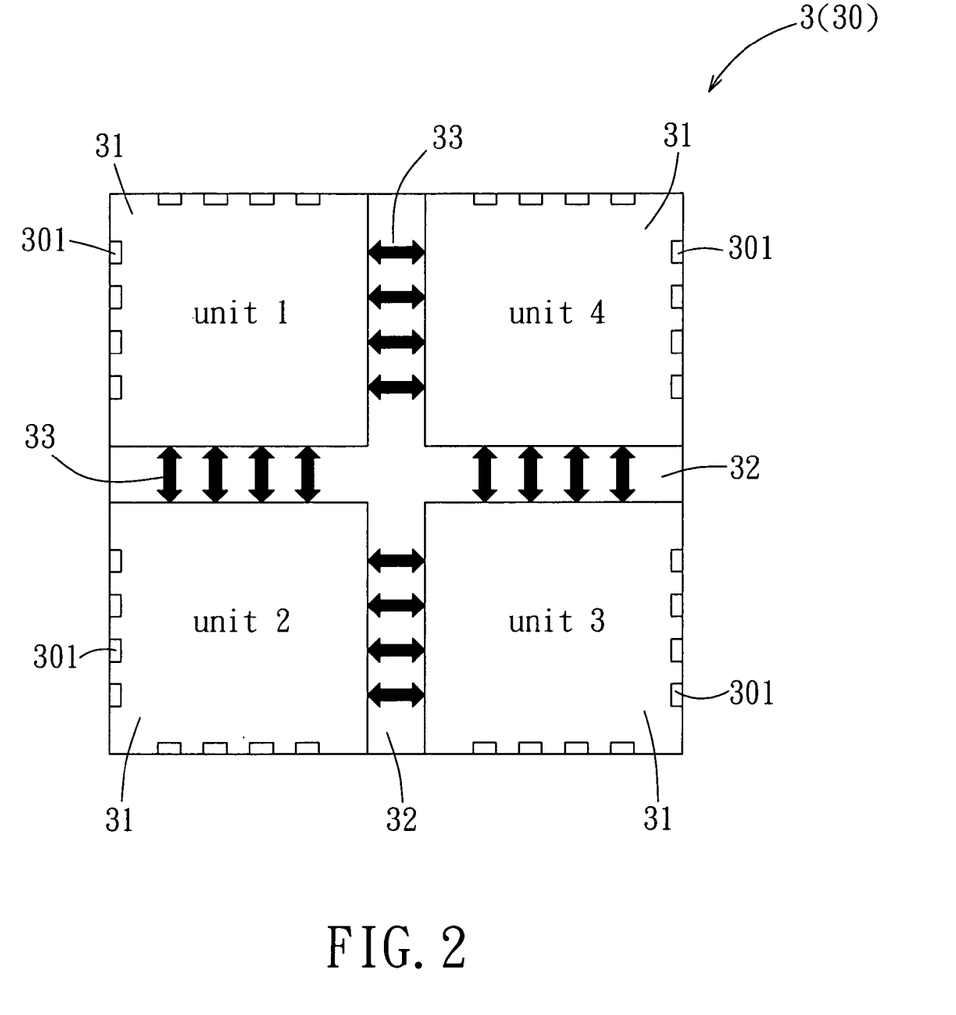
FIG. 2 is a schematic diagram of a wafer fabricated according to an integrated circuit component mask layout set prepared for a first application.
Figure 7:
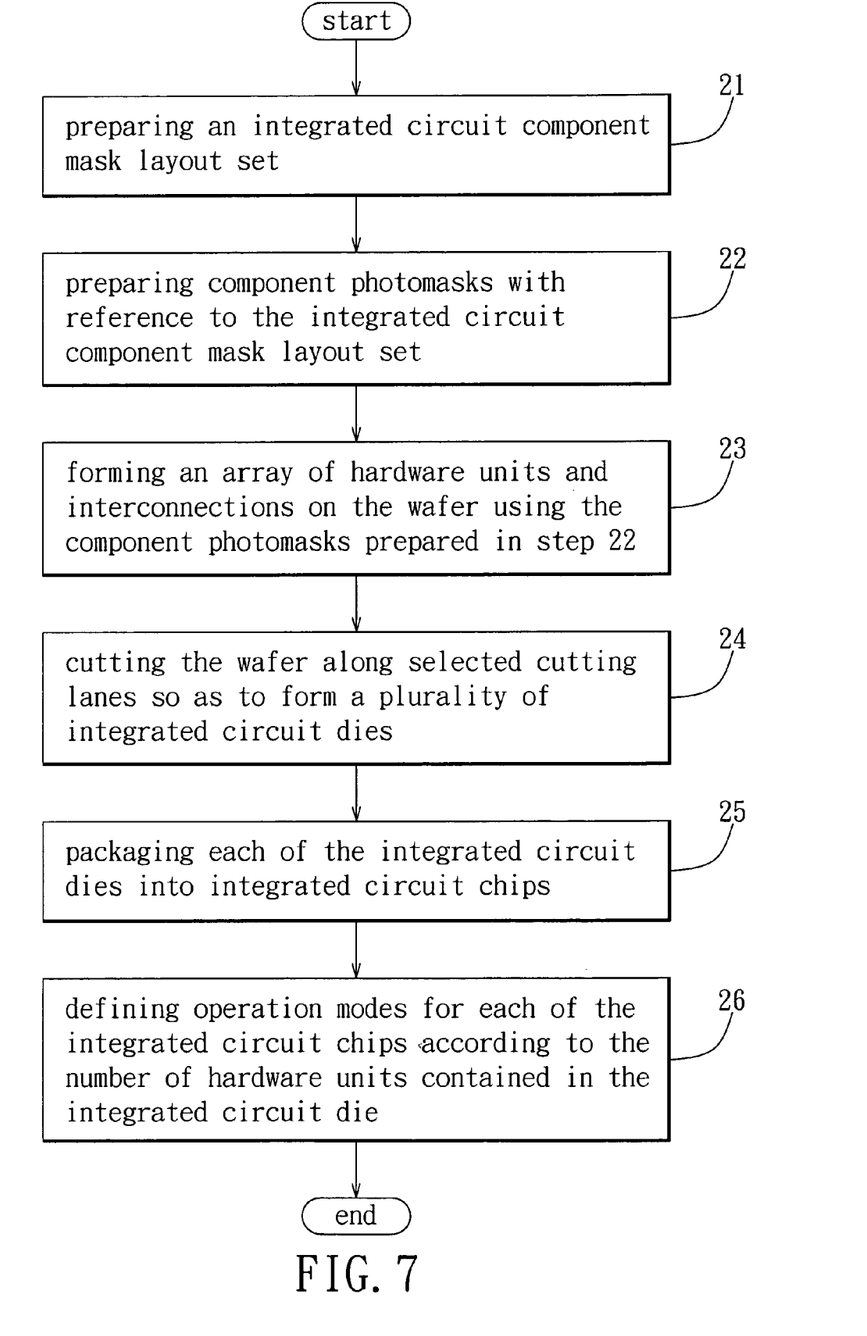
FIG. 7 is a flow chart, illustrating the method of fabricating integrated circuits according to the preferred embodiment of the present invention.

With reference to FIG. 1, FIG. 2 and FIG. 7, the preferred embodiment of a method of fabricating integrated circuits according to the present invention includes the following steps.

Figure 6:
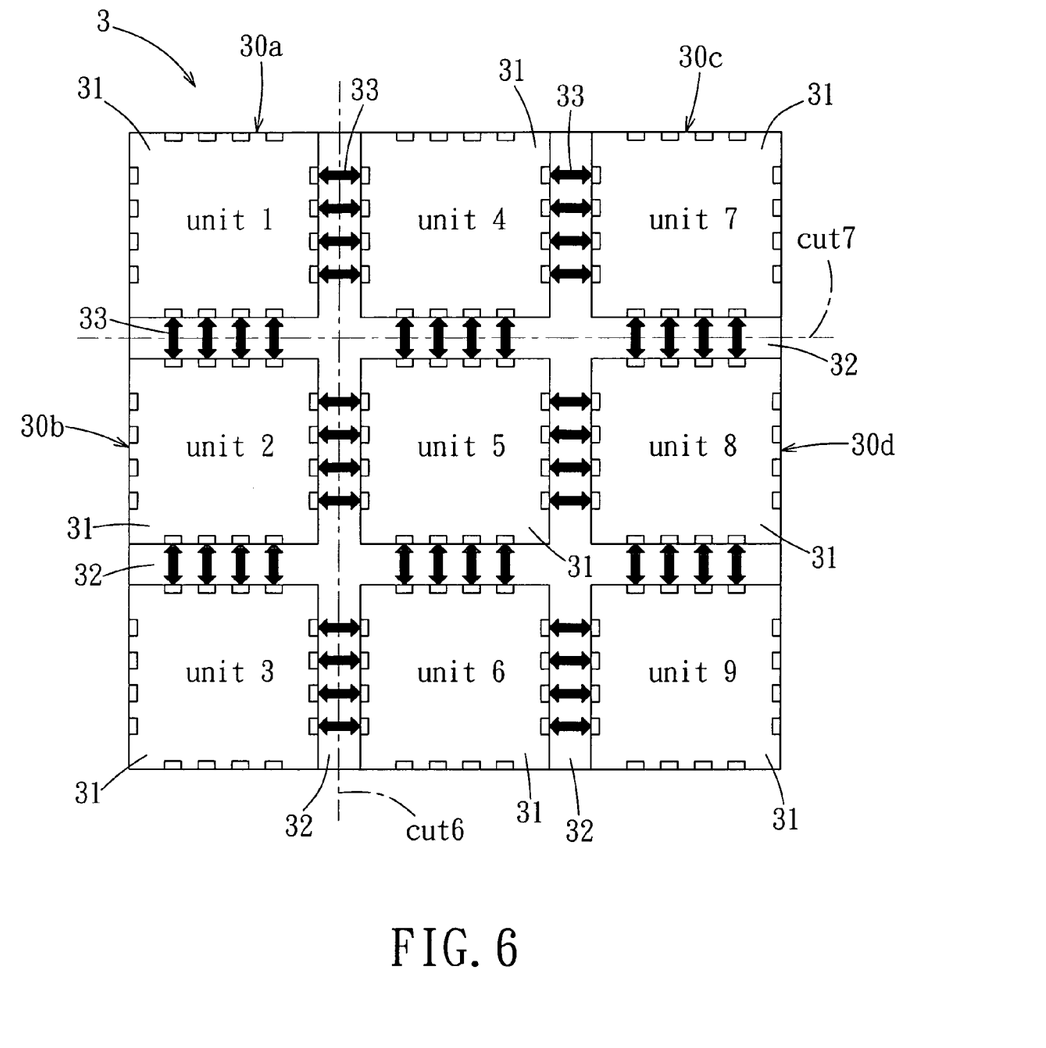
FIG. 6 is a schematic diagram of a wafer fabricated according to another embodiment of the present invention, where four integrated circuit dies are obtained from the wafer, with one being a single-type, two being dual-types and one being a quad-type.

In step 21, with reference to a physical design of a circuit of a hardware unit 31, an integrated circuit component mask layout set 1 is prepared. The integrated circuit component mask layout set 1 is associated with component photomasks (not shown) suitable for fabricating an array of the hardware units 31 on a wafer 3, for example, as shown in FIG. 2 or FIG. 6. In the examples shown below, each of the hardware units 31 is a receiver of a wireless communication system. It should be noted herein that since the component photomasks have similar appearances to the layouts (layout$_1$, layout$_2$, layout$_3$, . . . , layout$_S$) of the component mask layout set 1 as illustrated in FIG. 1, further drawings of the same are not provided herein for the sake of brevity.

The integrated circuit component mask layout set 1 has at array of component mask layout portions 11 that correspond respectively to places of the hardware units 31 on the wafer 3, and a grid of spacer lines 12 that serve to isolate adjacent ones of the component mask layout portions 11 from each other, such that the hardware units 31 are spaced apart from each other by a grid of scribe lines 32 corresponding to the spacer lines 12 when the hardware units 31 are formed on the wafer 3 using the component photomasks (not shown). In the illustrative example shown in FIG. 1, the integrated circuit component mask layout set 1 has an array of four component mask layout portions 11, also referred to as component mask layout portions ($P_{unit1}$, $P_{unit2}$, $P_{unit3}$, $P_{unit4}$), that respectively correspond to places of four hardware units 31, also referred to as hardware units (unit1, unit2, unit3, unit4), on the wafer 3 shown in FIG. 2.

The integrated circuit component mask layout set 1 further has interconnect mask layout portions ($P_{connect}$) that are suitable for fabricating interconnections 33 on the wafer 3. The interconnections 33 establish electrical connections between adjacent ones of the hardware units 31 on the wafer 3 via a plurality of conductive paths that span the scribe lines 32.

In step 22, the component photomasks (not shown) are prepared with reference to the integrated circuit component mask layout set 1. Each of the component photomasks has component mask portions respectively corresponding to the component mask layout portions 11, and configured for fabricating the array of the hardware units 31 on the wafer 3. Each of a subset of the component photomasks further has interconnect mask portions corresponding to the interconnect mask layout portions ($P_{connect}$), and configured for fabricating the interconnections 33 on the wafer 3.

In step 23, the array of the hardware units 31 and the interconnections 33 are formed on the wafer 3 using the component photomasks prepared in step 22 through conventional semiconductor fabrication techniques.

In step 24, the wafer 3 is cut along selected ones of the scribe lines 32 so as to form a plurality of integrated circuit dies 30.

In some embodiments of the present invention, the integrated circuit dies 30 obtained from one wafer 3 include the same number of hardware units 31, such as the ones shown in the examples of FIGS. 2~5. On the other hand, in some other embodiments of the present invention, each of the integrated circuit dies 30 is independently selected from a single-type including only one of the hardware units 31 and a multi-type including a plurality of the hardware units 31 that are interconnected electrically via uncut ones of the conductive paths, such as the ones shown in the example of FIG. 6.

In step 25, each of the integrated circuit dies 30 is packaged into integrated circuit chips (not shown)

In step 26, operation modes are defined for each of the integrated circuit chips according to the number of the hardware units 31 contained in the integrated circuit die 30 corresponding to the integrated circuit chip.

To better illustrate the present invention, assume that the integrated circuit component mask layout set 1 includes a total of a first number (S) of layouts (layout$_1$, layout$_2$, layout$_3$, . . . , layout$_S$), among which a second number (M) of layouts has the interconnect mask layout portions ($P_{connect}$) that are suitable for fabricating the interconnections 33 on the wafer 3, where the second number (M) is an integer smaller than the first number (S). It should be noted herein that, although the second number (M) of layouts that have the interconnect mask layout portions ($P_{connect}$) are shown to be suitable for fabricating bottom layers of the wafer 3 (shown in FIG. 2) in FIG. 1, in other embodiments of the present invention, the second number (M) of layouts may be suitable for fabricating upper layers, or any selected layers of the wafer 3.

The integrated circuit component mask layout set 1 has the array of component mask layout portions 11 that correspond respectively to places of the hardware units 31 on the wafer 3. In particular, the component mask layout portions (the set of $P_{unitX}$ of all the layouts (layout$_1$, layout$_2$, layout$_3$, . . . , layout$_S$)) are used for fabricating patterns necessary for independent operation of the corresponding hardware unit (unitX) where (X) is one of 1, 2, 3 and 4.

For the following description, it is assumed that, in a first application, it is desired to fabricate integrated circuit dies 30 (or integrated circuit chips) each including four hardware units 31 as illustrated in FIG. 2, using the method of the present invention. With reference to FIG. 1, in the integrated circuit component mask layout set 1 designed for the first application (hereinafter also referred to as the first integrated circuit component mask layout set 1), each of the first number ($S_1$) of layouts (layout$_1$, layout$_2$, layout$_3$, . . . , layout$_S$) has four component mask layout portions ($P_{unit1}$, $P_{unit2}$, $P_{unit3}$, $P_{unit4}$) that respectively correspond to places of the four hardware units (unit1, unit2, unit3, unit4) on the wafer 3. The four component mask layout portions ($P_{unit1}$, $P_{unit2}$, $P_{unit3}$, $P_{unit4}$) are spaced apart by the spacer lines 12 that form a cross-shape in this example. Moreover, each of the second number ($M_1$) of layouts of the first integrated circuit component mask layout set 1, namely (layout$_3$, . . . , layout$_S$) further has interconnect mask layout portions ($P_{connect}$) on the spacer lines 12. The interconnect mask layout portions ($P_{connect}$) correspond to places of the interconnections 33 that are to be formed on the wafer 3 for establishing electrical connections between the hardware units (unit1, unit2, unit3, unit4) in each integrated circuit die 30. In the example shown in FIG. 1, the second number ($M_1$) is smaller than the first number ($S_1$) by two, i.e., ($M_1 = S_1 - 2$).

With the first integrated circuit component mask layout set 1 designed in this manner, no scribe line 32 needs to be selected for cutting in step 24 to result in the integrated circuit die 30 for the purpose of the first application, where it is desired to fabricate integrated circuit chips/dies with four hardware units 31 each. In other words, only one integrated circuit die 30 is obtained from the wafer 3 in FIG. 2, and the integrated circuit die 30 includes all four of the hardware units (unit1, unit2, unit3, unit4). In addition, the integrated circuit die 30 has connection points 301, at least a portion of which is used for input/output purposes.

Figure 3:
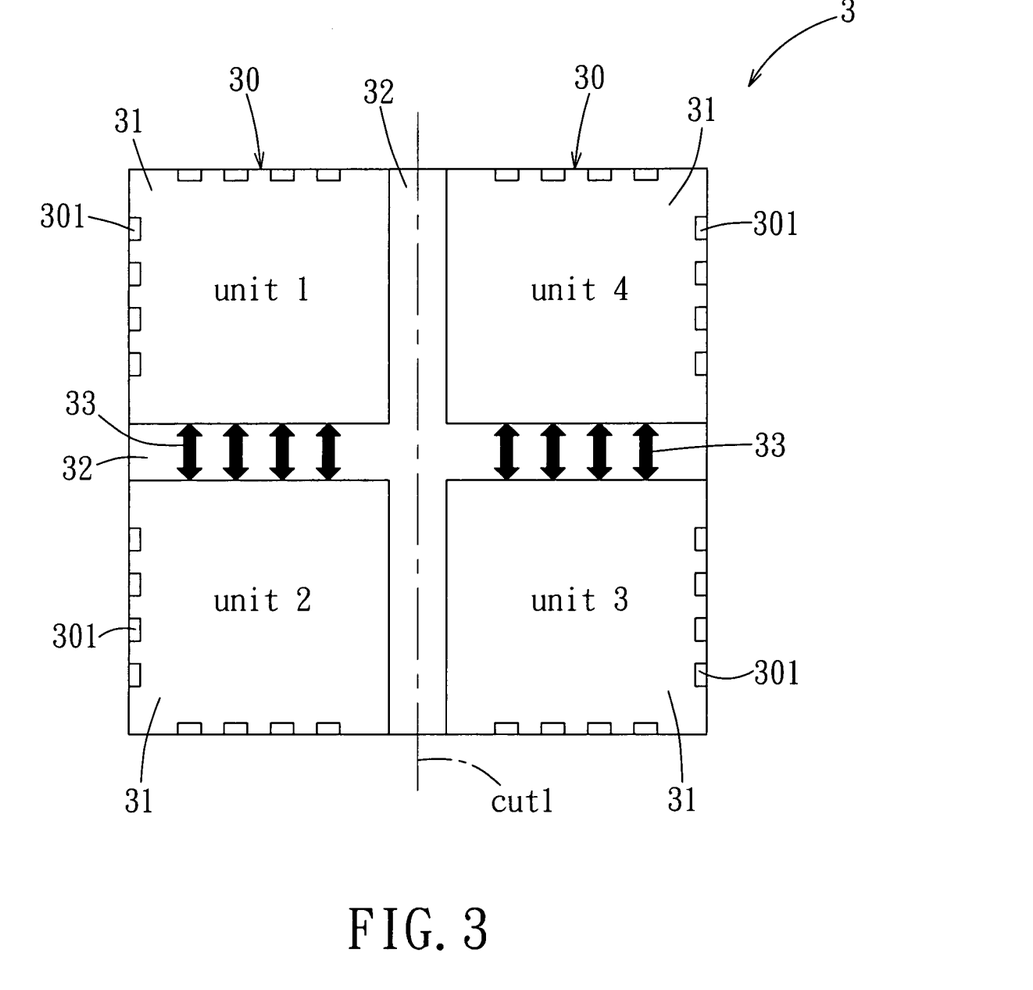
FIG. 3 is a schematic diagram of a wafer fabricated according to an integrated circuit component mask layout set prepared for a second application.

However, when it is desired to fabricate integrated circuit chips/dies each including two hardware units 31, i.e., hardware units (unit1, unit2), as illustrated in FIG. 3 for a second application, only a limited number of changes needs to be made on the first integrated circuit component mask layout set 1 to result in an integrated circuit component mask layout set 1 for the second application (hereinafter also referred to as the second integrated circuit component mask layout set 1). In particular, since the only difference between the first application and the second application lies in the interconnections 33 between the hardware units 31 on the wafer 3, a maximum of only the second number ($M_1$) of layouts of the first integrated circuit component mask layout set 1 need to be replaced so as to result in the second integrated circuit component mask layout set 1, while the rest of the layouts (i.e., at least ($S_1 - M_1$) number of layouts of the first integrated circuit component mask layout set 1) remain unchanged. In simpler cases, there is a possibility that only a certain portion of the second number ($M_1$) of layouts of the first integrated circuit component mask layout set 1 needs to be replaced so as to result in the second integrated circuit component mask layout set 1. In other words, at least ($S_1-M_1$) number of layouts will be common between the first integrated circuit component mask layout set 1 and the second integrated circuit component mask layout set 1, thereby reducing the total number of layouts that needs to be designed for the purpose of fabricating the integrated circuit chips/dies for both the first and second applications, which in turn also reduces the total number of the component photomasks that needs to be prepared for the purpose of fabricating the integrated circuit chips/dies for both the first and second applications.

For illustration purposes, suppose that out of the second number ($M_1$) of layouts, a third number ($M_2$) of layouts in the first integrated circuit component mask layout set 1 needs to be replaced so as to result in the second integrated circuit component mask layout set 1, i.e., ($M_1-M_2$) number of layouts are identical in the two integrated circuit component mask layout sets 1, where ($M_2 \leq M_1$). Therefore, for the first and second applications altogether, it is only necessary to design a total of ($S_1+M_2$) number of layouts for fabricating the component photomasks, as opposed to a total of ($S_1+S_2$) number of layouts in the prior art, where ($S_2$) refers to the number of layouts to be designed for an integrated circuit component mask layout set 1 specifically directed to the second application.

With the second integrated circuit component mask layout set 1 designed in this manner, the scribe line 32 along line (cut1) as shown in FIG. 3 is selected for cutting in step 24 for the purpose of the second application, where it is desired to fabricate integrated circuit dies 30 with two hardware units 31 each. In other words, two integrated circuit dies 30 are obtained from the wafer 3, and respectively include the hardware units (unit1, unit2), and the hardware units (unit3, unit4). Each resulting integrated circuit die 30 has connection points 301, at least a portion of which is used for input/output purposes.

Figure 4:
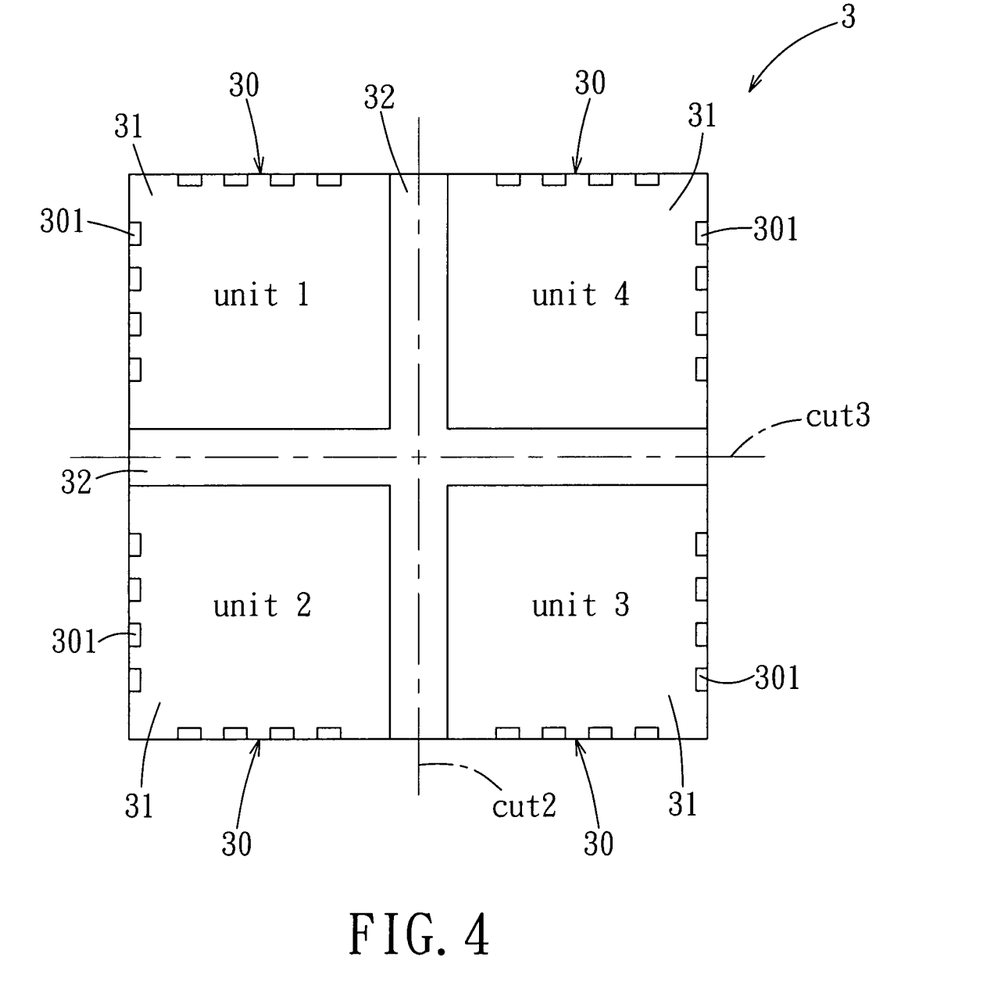
FIG. 4 is a schematic diagram of a wafer fabricated according to an integrated circuit component mask layout set prepared for a third application.

Furthermore, when it is desired to fabricate integrated circuit chips, each including only one hardware unit 31 as illustrated in FIG. 4 for a third application, out of the third number ($M_2$) of layouts in the second integrated circuit component mask layout set 1, a fourth number ($M_3$) of layouts needs to be replaced so as to result in an integrated circuit component mask layout set 1 for the third application (hereinafter also referred to as the third integrated circuit component mask layout set 1), i.e., ($M_2-M_3$) number of layouts are identical in the second and third integrated circuit component mask layout sets 1, where ($M_3 \leq M_2$). Therefore, for the first, second and third applications altogether, it is only necessary to design a total of ($S_1+M_2+M_3$) number of layouts for fabricating the component photomasks, as opposed to a total of ($S_1+S_2+S_3$) number of layouts in the prior art, where ($S_3$) refers to the number of layouts to be designed for an integrated circuit component layout set 1 specifically directed to the third application.

With the third integrated circuit component mask layout set 1 designed in this manner, the scribe lines 32 along both lines (cut2) and (cut3) as shown in FIG. 4 are selected for cutting in step 24 for the purpose of the third application, where it is desired to fabricate integrated circuit dies 30 with a single hardware unit 31 each. In other words, four integrated circuit dies 30 are obtained from the wafer 3, and respectively include the hardware unit (unit1), the hardware unit (unit2), the hardware unit (unit3), and the hardware unit (unit4). Each resulting integrated circuit die 30 has connection points 301, at least a portion of which is used for input/output purposes.

It should be noted herein that the replacement of selected layouts in the integrated circuit component mask layout set 1 is for the purpose of modifying the interconnections 33 on the wafer 3 for one application into something suitable for another application in order to eliminate floating points on the hardware units 31 that might result in malfunctions of the hardware units 31.

It should also be noted herein that each of the scribe lines 32 on the wafer 3 should have a width sufficient for standard wafer dicing procedures. Therefore, such is to be taken into consideration when preparing the integrated circuit component mask layout set 1 in step 21.

From the above, it is evident that, when preparing the integrated circuit component mask layout set 1, by concentrating the routines designated for independent operation of each hardware unit 31 to a specific area on the wafer 3, by concentrating the routings designated for the interconnections 33 between adjacent hardware units 31 on the wafer 3 to span only within the scribe lines 32, and by concentrating the routings designated for the interconnections 33 to require the use of only a subset of the component photomasks fabricated according to the integrated circuit component mask layout set 1, the total number of component photomasks that needs to be fabricated for producing single-type and multi-type integrated circuits, each including a different number of hardware units 31 can be minimized. In addition, since electrical connections between adjacent ones of the hardware units 31 of each resulting integrated circuit using the method of the present invention are established directly on the wafer 3 by the interconnections 33 via conductive paths that span the scribe lines 32, transmission between the hardware units 31 is better as compared to the prior art, where transmission speed is limited by the number of pins and pads contained within each integrated circuit chip (including one hardware unit only).

Figure 5:
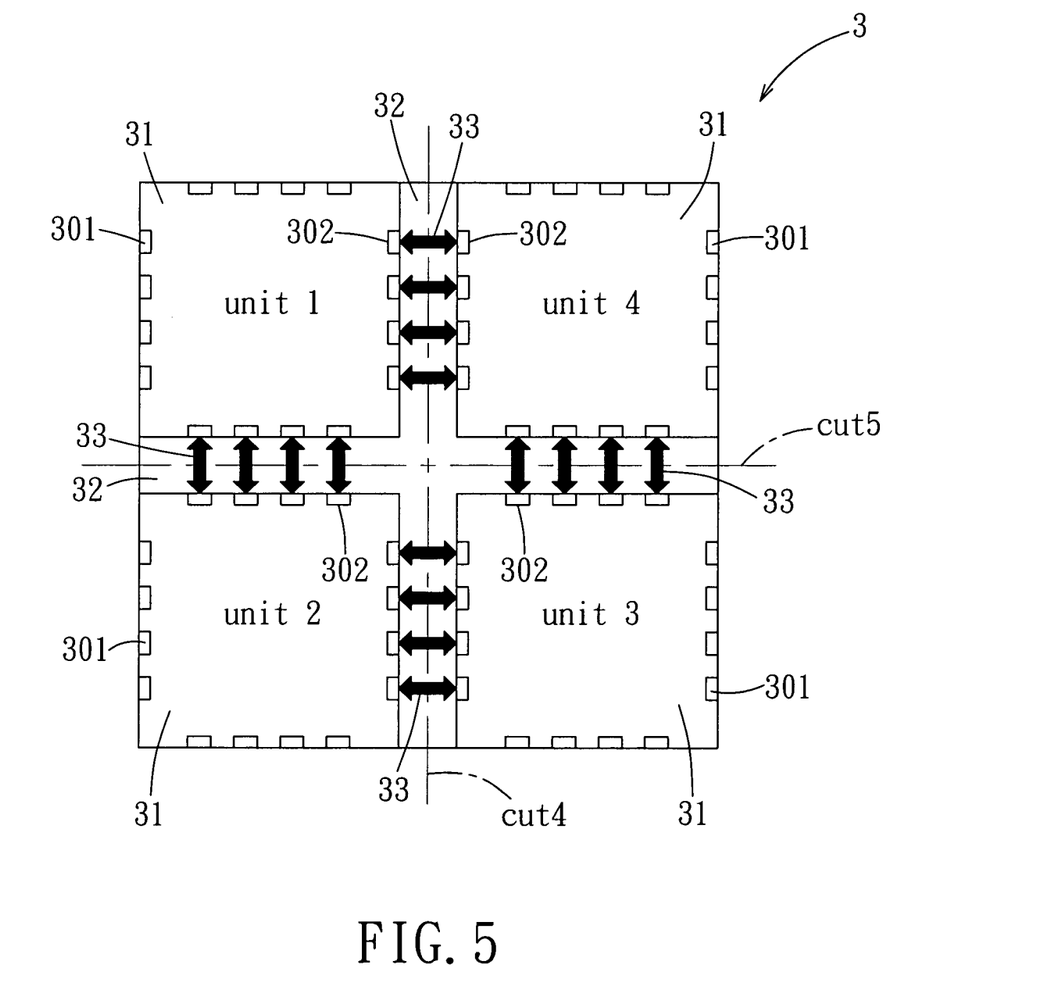
FIG. 5 is a schematic diagram of a wafer fabricated according to an integrated circuit component mask layout set prepared for a fourth application.

With reference to FIG. 5, when it is desired to fabricate integrated circuit dies 30, each including a single hardware unit 31, in a fourth application, and when the presence of floating points does not affect or interfere with independent operation of the hardware unit 31, the first integrated circuit component mask layout set 1 prepared for the first application mentioned above can be used for fabricating the integrated circuit dies 30 of the fourth application, with the additional step of cutting the scribe lines 32 along lines (cut4) and (cut5) in step 24. In this manner, each resulting integrated circuit die 30 has connection points 301 and 302, at least a portion of which is used for input/output purposes.

In a more complex example shown in FIG. 6, the wafer 3 is formed with nine hardware units 31, and the scribe lines 32 along lines (cut6) and (cut7) are selected for cutting in step 24 to result in four integrated circuit dies 30a, 30b, 30c, 30d, where the integrated circuit die 30a is a single-type including hardware unit (unit1), the integrated circuit dies 30b and 30c are dual-type, respectively including two hardware units (unit2, unit3), and two hardware units (unit4, unit7), while the integrated circuit die 30d is a quad-type including four hardware units (unit5, unit6, unit8, unit9).

It should be noted herein that in the above examples, the interconnections 33 on the wafer 3 are in the form of one of metal traces, vias, and a combination thereof, but are not limited thereto in other embodiments of the present invention. Moreover, the interconnect mask layout portions ($P_{connect}$) may be distributed among consecutive layouts within the integrated circuit component mask layout set 1, or may be alternately distributed throughout within the integrated circuit component mask layout set 1 on selected ones of the layouts depending on the particular application/design. Similarly, it is also unnecessary for the layouts in the integrated circuit component mask layout set 1 designed for one application that need to be replaced so as to form the integrated circuit component mask layout set 1 for another application to be in a consecutive manner.

In sum, during preparation of the integrated circuit component mask layout set 1, it can be ensured that the total number of component photomasks that needs to be prepared for producing integrated circuits each including a different number of hardware units 31 is minimized by concentrating the routings designated for independent operation of each hardware unit 31 to specific areas on the wafer 3, by concentrating the routings designated for the interconnections 33 between adjacent hardware units 31 on the wafer 3 to span only within the scribe lines 32 that keeps the routings designated for independent operation of each hardware unit 31 apart from each other, and by concentrating the routings designated for the interconnections 33 to require the use of only a subset of the component photomasks fabricated according to the integrated circuit component mask layout set 1.

In addition, in applications where independent operation of the hardware units 31 are unaffected by floating points resulting from cutting the conductive paths that are used to establish electrical connections between the hardware units 31 and that span the scribe lines 32, any of the scribe lines 32 may be selected for cutting in step 24 of the method of the present invention to result in integrated circuit dies 30 that are independently single-type and multi-type, while good transmission is still ensured between the hardware units 31 within each multi-type integrated circuit die 30 by the interconnections 33 in the form of conductive paths that span the uncut ones of the scribe lines 32.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method of fabricating integrated circuits, comprising the steps of:
   a) with reference to a physical design of a circuit of a hardware unit, preparing an integrated circuit component mask layout set associated with component photomasks suitable for fabricating an array of the hardware units on a wafer,
   wherein the integrated circuit component mask layout set has an array of component mask layout portions that correspond respectively to places of the hardware units on the wafer, and a grid of spacer lines that serve to isolate adjacent ones of the component mask layout portions from each other, such that the hardware units are spaced apart from each other by a grid of scribe lines corresponding to the spacer lines when the hardware units are formed on the wafer using the component photomasks, and
   wherein the integrated circuit component mask layout set further has interconnect mask layout portions that are suitable for fabricating interconnections on the wafer, the interconnections establishing electrical connections between adjacent ones of the hardware units on the wafer via a plurality of conductive paths that span the scribe lines;
   b) preparing the component photomasks with reference to the integrated circuit component mask layout set,
   wherein each of the component photomasks has component mask portions respectively corresponding to the component mask layout portions, and configured for fabricating the array of the hardware units on the wafer,
   wherein each of a subset of the component photomasks further has interconnect mask portions corresponding to the interconnect mask layout portions, and configured for fabricating the interconnections on the wafer;
   c) forming the array of the hardware units and the interconnections on the wafer using the component photomasks prepared in step b); and
   d) cutting the wafer along selected ones of the scribe lines so as to form a plurality of integrated circuit dies;
   wherein each of the integrated circuit dies is independently selected from a single-type including only one of the hardware units, and a multi-type including a plurality of the hardware units that are interconnected electrically via uncut ones of the conductive paths.

2. The method of fabricating integrated circuits as claimed in claim 1, wherein said interconnections are in the form of one of metal traces, vias, and a combination thereof.

3. The method of fabricating integrated circuits as claimed in claim 1, wherein each of the integrated circuit dies has a plurality of connection points respectively corresponding to cut ones of the conductive paths, at least a portion of said connection points being used for input/output purposes.

4. The method of fabricating integrated circuits as claimed in claim 1, further comprising the step of:
   e) packaging each of the integrated circuit dies into integrated circuit chips; and
   f) defining operation modes for each of the integrated circuit chips according to number of the hardware units contained in the integrated circuit die corresponding to the integrated circuit chip.

5. The method of fabricating integrated circuits as claimed in claim 1, wherein each of the hardware units is a receiver.

* * * * *